United States Patent
Chu et al.

(10) Patent No.: US 8,466,824 B2
(45) Date of Patent: Jun. 18, 2013

(54) CURRENT PROVIDING SYSTEM, ADC WITH THE CURRENT PROVIDING SYSTEM, AND CURRENT PROVIDING METHOD

(75) Inventors: Yen-Hsin Chu, Kaohsiung (TW); Meng-Hsuan Wu, Taipei (TW)

(73) Assignee: Faraday Technology Corp., Science-Based Industrial Park, Hsin-Chu (TW)

(*) Notice: Subject to any disclaimer, the term of this patent is extended or adjusted under 35 U.S.C. 154(b) by 173 days.

(21) Appl. No.: 13/151,291

(22) Filed: Jun. 2, 2011

(65) Prior Publication Data

US 2012/0306680 A1 Dec. 6, 2012

(51) Int. Cl.
*H03M 1/60* (2006.01)

(52) U.S. Cl.
USPC ............................ 341/157; 341/161; 341/162

(58) Field of Classification Search
USPC .......................................... 341/157, 161–162
See application file for complete search history.

(56) References Cited

U.S. PATENT DOCUMENTS

| 6,501,411 | B2 * | 12/2002 | Soundarapandian et al. | 341/161 |
| 6,798,372 | B1 * | 9/2004 | Yang et al. ................... | 341/157 |
| 6,999,020 | B2 * | 2/2006 | Mizumasa et al. ........... | 341/162 |
| 7,242,341 | B2 * | 7/2007 | Ariyoshi ....................... | 341/157 |

OTHER PUBLICATIONS

Terje Nortvedt Andersen, "A Cost-Efficient High-Speed 12-bit Pipeline ADC in 0.18-μm Digital CMOS", P1506-1513, IEEE Journal of Solid-State Circuits, vol. 40, No. 7, Jul. 2005.
Imran Ahmed, "A 50-MS/s (35 mW) to 1-kS/s (15 μW) Power Scaleable 10-bit Pipelined ADC Using Rapid Power-On Opamps and Minimal Bias Current Variation", P2446-2455, IEEE Journal of Solid-State Circuits, vol. 40, No. 12, Dec. 2005.

* cited by examiner

*Primary Examiner* — Khai M Nguyen
(74) *Attorney, Agent, or Firm* — Winston Hsu; Scott Margo

(57) ABSTRACT

A current providing system, for providing an output current, which comprises: a frequency detecting circuit, for receiving at least one input signal, and for detecting a frequency of the input signal; a frequency-controlled current providing circuit, for providing the output current according to the input signal frequency when the input signal frequency is in a first predetermined range; and a predetermined current providing circuit, for providing the output current with a first predetermined current value, when the input signal frequency is not in the first predetermined range.

21 Claims, 6 Drawing Sheets

CURRENT PROVIDING SYSTEM, ADC WITH THE CURRENT PROVIDING SYSTEM, AND CURRENT PROVIDING METHOD

BACKGROUND OF THE INVENTION

1. Field of the Invention

The present invention relates to a current supplying system, an ADC utilizing the current supplying system to provide a biasing current and a current providing method, and particularly relates to a current supplying system providing a constant current at low frequency, an ADC utilizing the current supplying system to provide a biasing current and a current providing method.

2. Description of the Prior Art

Normally, a pipe line ADC (analog to digital converter) utilizes a dynamic biasing circuit as a inside biasing circuit. Based on this structure, the pipe line ADC may have different power for different operating frequencies, such that the power consumption can be optimized. Via such mechanism, the pipe line ADC can operate at different frequencies, such that it is not necessary to design different pipe line ADCs for different operating frequencies.

An ADC always utilized a voltage to current circuit and a constant resistor to generate a constant biasing current. The dynamic biasing circuit utilizes variable resistor to generate different biasing voltages. For example, a switch capacitor circuit can be utilized as the variable resistor. If the capacitors of the switch capacitor circuit is charged and discharged by signals with different frequencies, it can be regarded as a resistor varying corresponding to the frequency. Accordingly, such kind of voltage to current circuit can change the current value corresponding to the frequency.

However, if the frequency of the signal is too low, the capacitor may leak when it is charged. Therefore, the dynamic biasing circuit may lose accuracy when the signal frequency is low.

SUMMARY OF THE INVENTION

One objective of the present invention is to provide a current providing system that can operate at low frequency.

Another objective is to provide an ADC that can operate at low frequency.

Another objective of the present application is to provide a current providing method that can provide a constant current at low frequency.

One embodiment of the present invention discloses a current providing system, for providing an output current, which comprises: a frequency detecting circuit, for receiving at least one input signal, and for detecting a frequency of the input signal; a frequency-controlled current providing circuit, for providing the output current according to the input signal frequency when the input signal frequency is in a first predetermined range; and a predetermined current providing circuit, for providing the output current with a first predetermined current value, when the input signal frequency is not in the first predetermined range.

Another embodiment of the present invention discloses an analog to digital converter, which comprises: a current providing system, for providing an output current. The current providing system comprises: a frequency detecting circuit, for receiving at least one input signal, and for detecting a frequency of the input signal; a frequency-controlled current providing circuit, for providing the output current according to the input signal frequency when the input signal frequency is in a first predetermined range; and a predetermined current providing circuit, for providing the output current with a first predetermined current value, when the input signal frequency is not in the first predetermined range.

Another embodiment of the present invention discloses a current providing method, for providing an output current. The current providing method comprises: (a) detecting a frequency of the input signal; (b) providing the output current according to the input signal frequency when the input signal frequency is in a first predetermined range; and (c) providing the output current with a first predetermined current value, when the input signal frequency is not in the first predetermined range.

In view of above-mentioned embodiments, a constant current can be provided when the input signal has lower frequency, to avoid prior art current leakage problem. Besides, the current can also be limited when the frequency is high, such that over current issue can be avoided. Additionally, the present invention also provides current providing mechanism with multi regions, such that more flexible design can be obtained.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
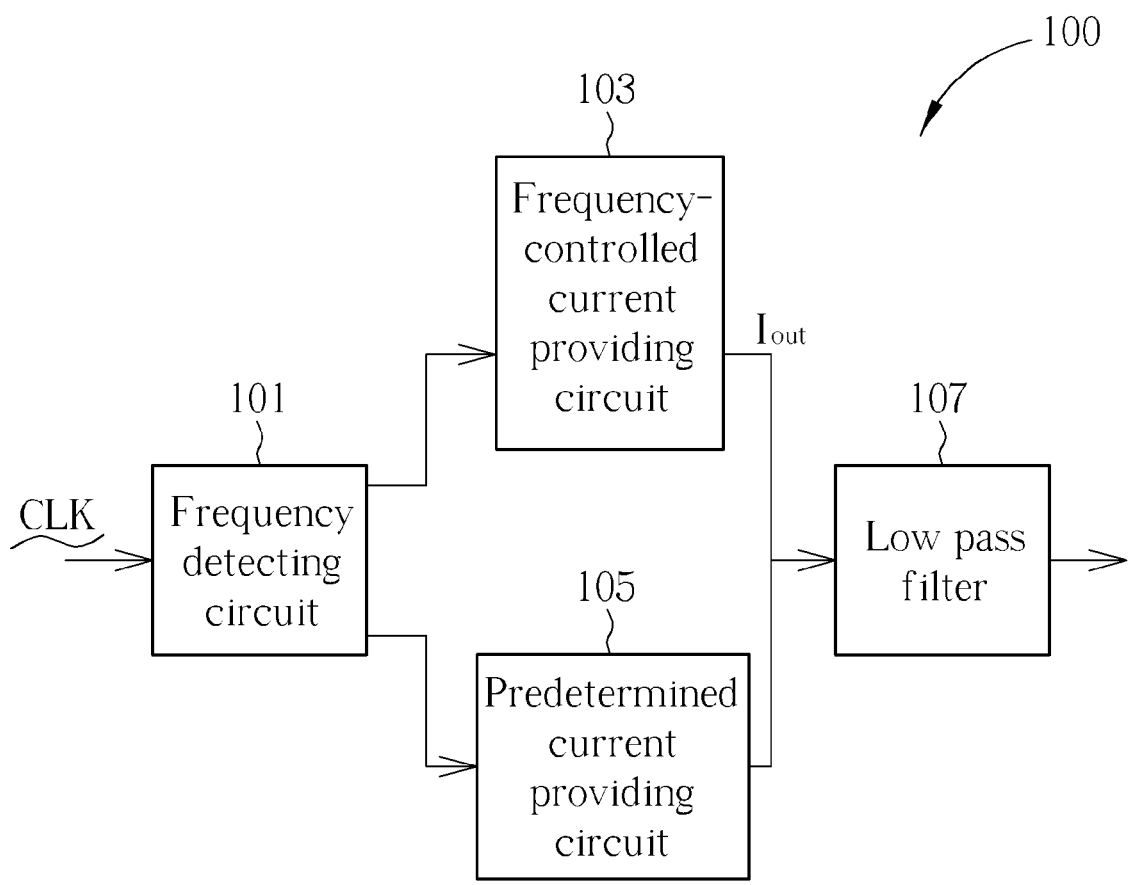
FIG. 1 is a block diagram illustrating a current providing system according to an embodiment of the present invention.

FIG. 1 is a block diagram illustrating a current providing system according to an embodiment of the present invention. As shown in FIG. 1, the current providing system 100 comprises a frequency detecting circuit 101, a frequency-controlled current providing circuit 103 and a predetermined current providing circuit 105. The frequency detecting circuit 101 receives at least one input signal (in this embodiment, CLK), receives at least one input signal, and detects a frequency of the input signal. Also, the frequency detecting circuit 101 controls the frequency-controlled current providing circuit 103 and the predetermined current providing circuit 105. The frequency-controlled current providing circuit 103 provides the output current $I_{out}$ according to the input signal frequency when the input signal frequency is in a first predetermined range. The predetermined current providing circuit 105 provides the output current $I_{out}$ with a first predetermined current value, when the input signal frequency is not in the first predetermined range. Besides, the current providing system 100 can further comprise a low pass filter 107, for filtering ripple of the output current $I_{out}$, such that the output current $I_{out}$ can be more stable. The current providing system 100 can be applied for biasing of an ADC, that is, the output current $I_{out}$ is utilized for biasing of the ADC. However, the above-mentioned circuit can also be applied to other circuits or other electronic systems. Detail circuits and operations of the current providing system 100 will be described as below.

Figure 2:
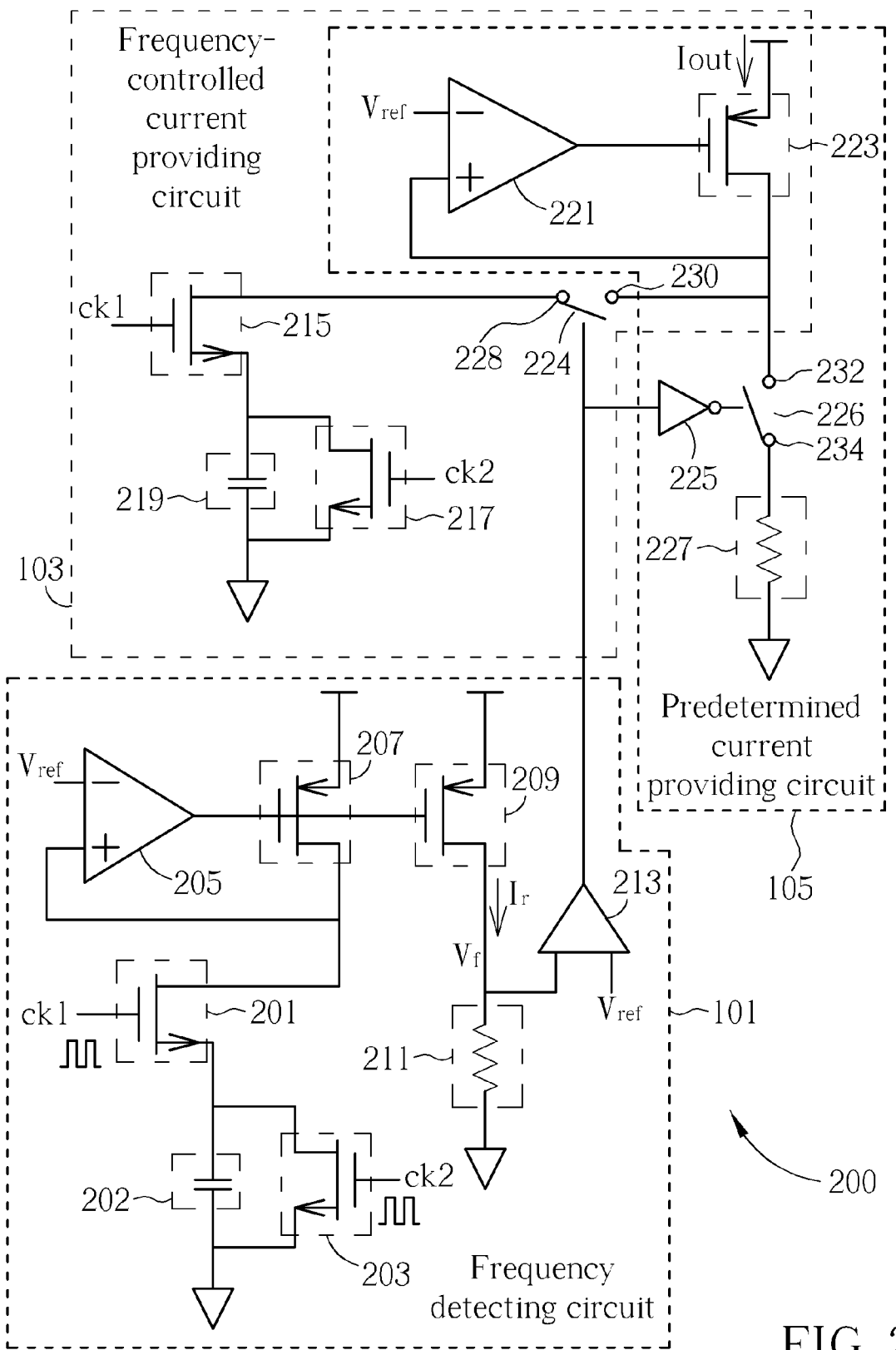
FIG. 2 is a circuit diagram for one example of the current providing system shown in FIG. 1.

FIG. 2 is a circuit diagram for one example of the current providing system 200 shown in FIG. 1. As shown in FIG. 2, the frequency detecting circuit 101 includes transistors 201, 203, 207 and 209, a capacitor 202, an error amplifier 205, a resistor 211 and a comparator 213. In this embodiment, the transistors 201 and 203 are N type MOSFETs, and the transistors 207, 209 are P type MOSFETs. In this embodiment, the transistors 201, 203 and the capacitor 202 form a switch capacitor circuit, that is, a variable resistor circuit that will provide different values of resistance corresponding to different received signal frequencies. The transistors 201, 203 are utilized to receive input signals ck1 and ck2, which can be signals having inversed phase with each other. Also, the transistors 201, 203 and the capacitor 202 provide an input signal resistor according to the frequencies of the input signals ck1 and ck2. The error amplifier 205 controls the transistor 207 to generate a constant current. The transistors 207, 209 form a current mirror, such that the transistor 209 generates an input signal current Ir the same as the current output from the transistor 207, to cooperate with the resistor 211 to generate an input signal voltage $V_f$. The comparator 213 compares the input signal voltage $V_f$ and a reference voltage $V_{ref}$. Since the input signal voltage Vf is determined by the frequencies of the input signals ck1 and ck2, thus the frequencies of the input signals ck1 and ck2 can be determined if they are smaller than a predetermined value, via comparing the input signal voltage $V_f$ and the reference voltage $V_{ref}$. In view of above-mentioned concept, the structures and the operations of the frequency detecting circuit 101 can be summarized as: a variable resistor circuit (transistors 201, 203 and the capacitor 202), for providing an input signal resistor according to the frequencies of the input signals ck1 and ck2; a current source (the error amplifier 205, and a current mirror composed of transistors 207 and 209), for providing an input signal current $I_r$ according to the input signal resistor; a resistance device (211), for generating an input signal voltage according to the input signal current; and a comparator (213), for comparing the input signal voltage $V_f$ and a reference voltage $V_{ref}$, to determine a frequency of the input signals ck1, ck2.

In this embodiment, a switch device 224 turns on and a switch device 226 turns off, when frequencies of the input signals ck1 and ck2 are larger than a predetermined value. Please note that the switch device 224 and the switch device 226 receive signals with opposite phases, since an inverter 225 is provided. Accordingly, one of the switch devices 224 and 226 turns on, when the other one of the switch devices 224 and 226 turns off. Please note that the definition for that the switch device 224 turns on indicates that the terminals 228 and 230 are conductive, and the definition for that the switch device 226 turns on indicates that the terminals 232 and 234 are conductive. Therefore, the frequency-controlled current providing circuit 103 generates the output current $I_{out}$ based on the frequencies of the input signals ck1, ck2. Additionally, the switch device 224 turns off and the switch device 226 turns on, when frequencies of the signals ck1 and ck2 are smaller than a predetermined value. Therefore, the predetermined current providing circuit 105 provides a constant output current $I_{out}$.

In this embodiment, the current providing circuit 103 includes transistors 215, 217 and 223, a capacitor 219, an error amplifier 221 and a switch device 224. The transistors 215, 217 and the capacitor 219 also for, a switch capacitor circuit, such that different input signal resistors are provided corresponding to different frequencies of signals ck1 and ck2. Similarly, the error amplifier 221 and the transistor 223 provide a constant current, such that different output currents $I_{out}$ are generated corresponding to different input signal resistors.

The predetermined current providing circuit 105 includes an inverter 225, a switch device 226 and a resistor 227, and shares the error amplifier 221 and the transistor 223 with the frequency-controlled current providing circuit 103. The error amplifier 221 and the transistor 223 provide a constant current if the switch device turns on, thereby cooperates with the resistor 227 to provide a constant output current $I_{out}$.

Figure 3A:
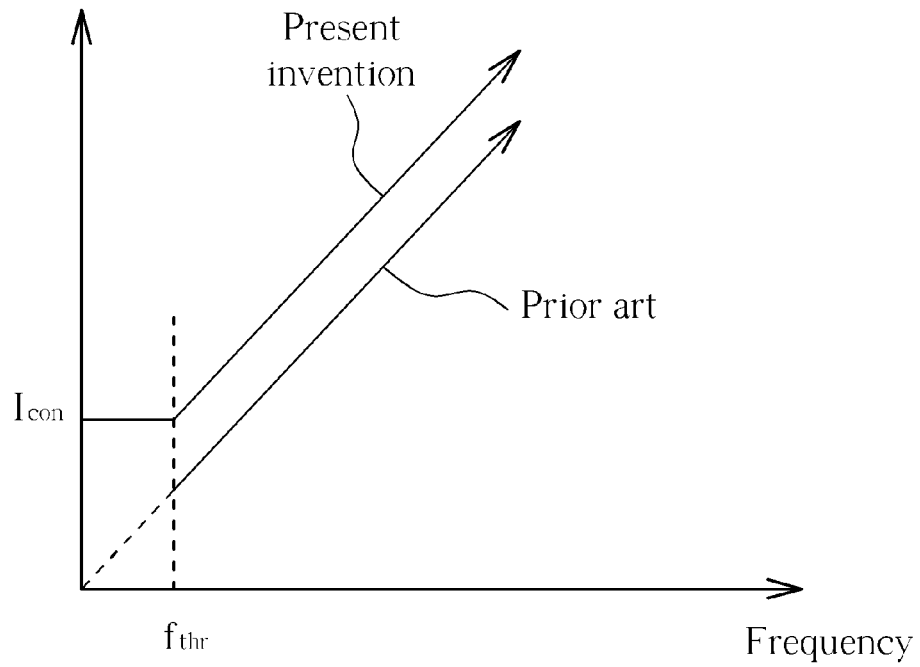
FIGS. 3A and 3B illustrate the relations between the output current and the input signal frequency, of the circuit shown in FIG. 2.
Figure 3B:
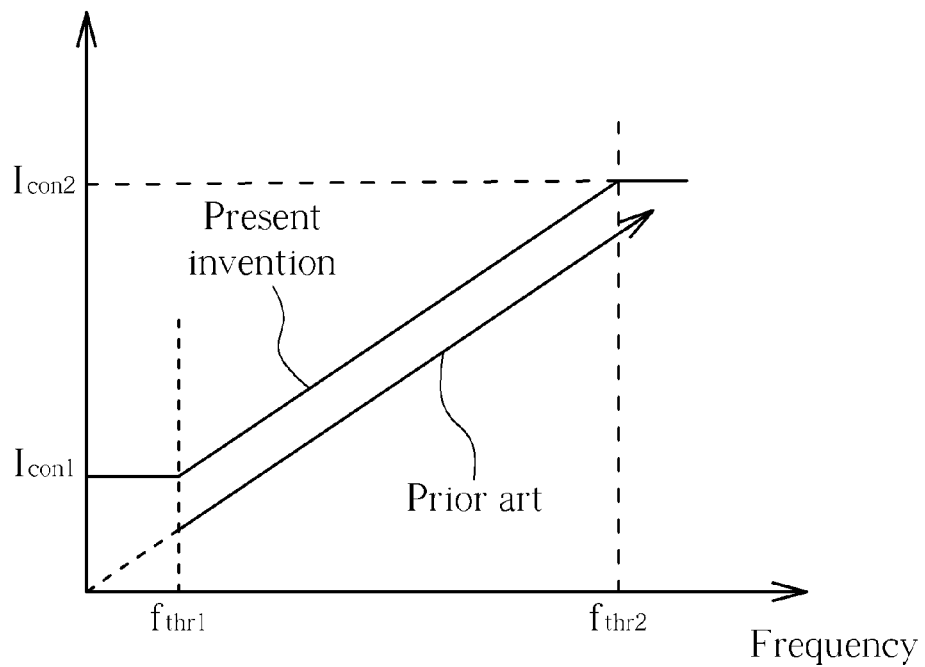

FIGS. 3A and 3B illustrate the relations between the output current and the input signal frequency, of the circuit shown in FIG. 2. In the embodiment shown in FIG. 3A, the output current is proportion to the frequency (generated by the frequency-controlled current providing circuit 103), when a frequency of the input signal is larger than the frequency threshold value $f_{thr}$. The output current is a constant current $I_{con}$, when a frequency of the input signal is smaller than the frequency threshold value $f_{thr}$. Via such mechanism, the prior art issue of inaccurate biasing voltage due to low input signal frequency can be avoided.

Please note the embodiment shown in FIG. 2 not only can limit the output current to a constant current when the input signal has too low frequency, but also can limit the output current to a constant current when the input signal has too high frequency. By this way, the current value can be limited to avoid damaging the circuit due to too large current. As shown in FIG. 3B, the output current is a constant current $I_{con1}$ when the input signal frequency is smaller than the frequency threshold value $f_{thr1}$. Also, the output current is a constant current $I_{con2}$ when the input signal frequency is larger than the frequency threshold value $f_{thr2}$.

Thus, the embodiments shown in FIG. 2, FIGS. 3A and 3B can be summarized as follows: The frequency-controlled current providing circuit provides the output current according to the input signal frequency when the input signal frequency is in a predetermined range. The predetermined current providing circuit provides the output current with a predetermined current value, when the input signal frequency is not in the predetermined range.

For the $I_{con}$ in FIG. 3A and $I_{con1}$ in FIG. 3B, the predetermined range is between a first frequency threshold value and a second frequency threshold value larger than the first frequency threshold value. The predetermined current providing circuit provides the output current with the predetermined current value when the input signal frequency is smaller than the first frequency threshold value.

For the $I_{con2}$ in FIG. 3B, the first predetermined range is between a first frequency threshold value $f_{thr1}$ and a second frequency threshold value $f_{thr2}$ larger than the first frequency threshold value $f_{thr1}$. The predetermined current providing circuit provides the output current with the predetermined current value when the input signal frequency is larger than the second frequency threshold value $f_{thr2}$.

Figure 4:
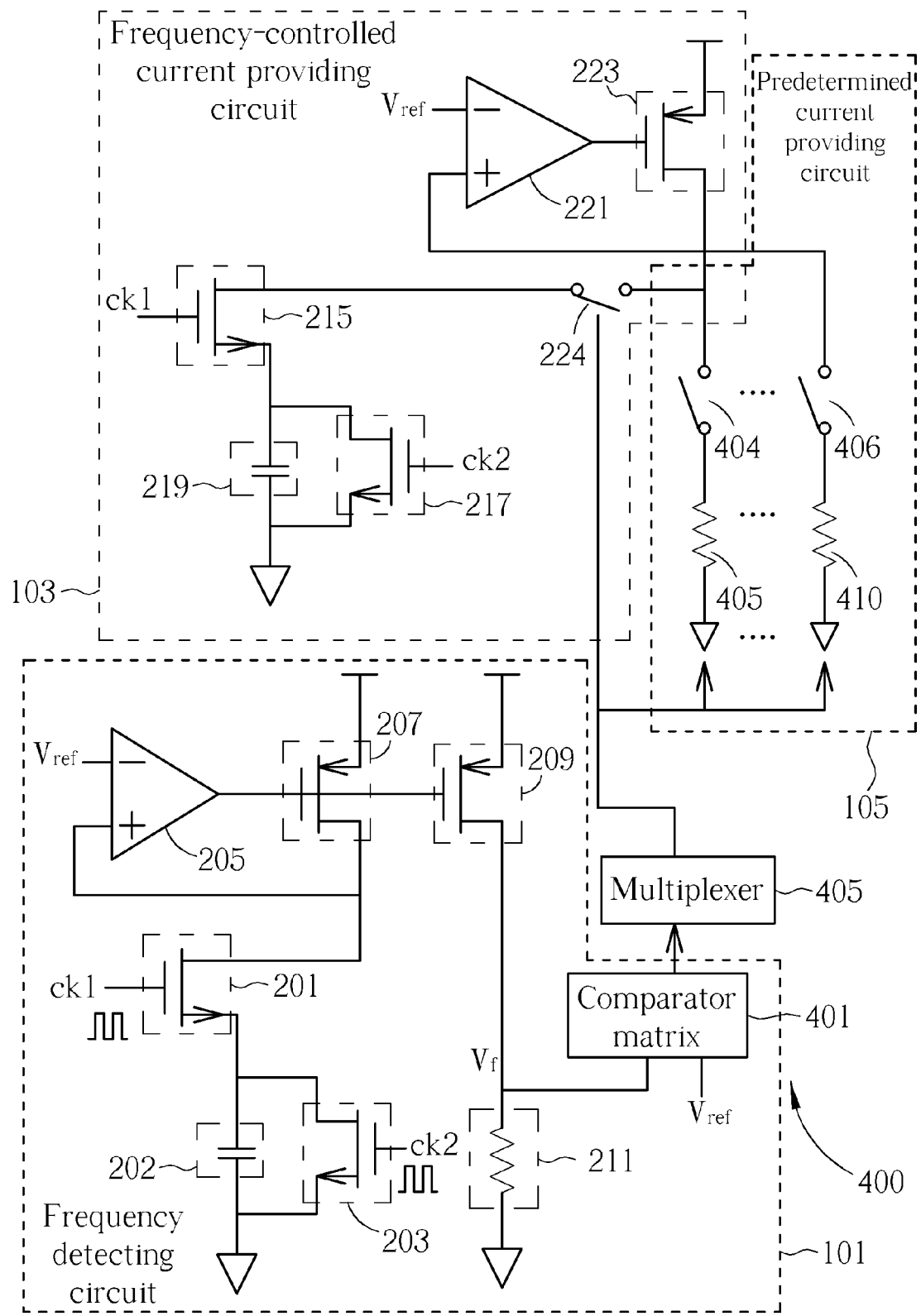
FIG. 4 is a circuit diagram for one example of the current providing system shown in FIG. 1.
Figure 5A:
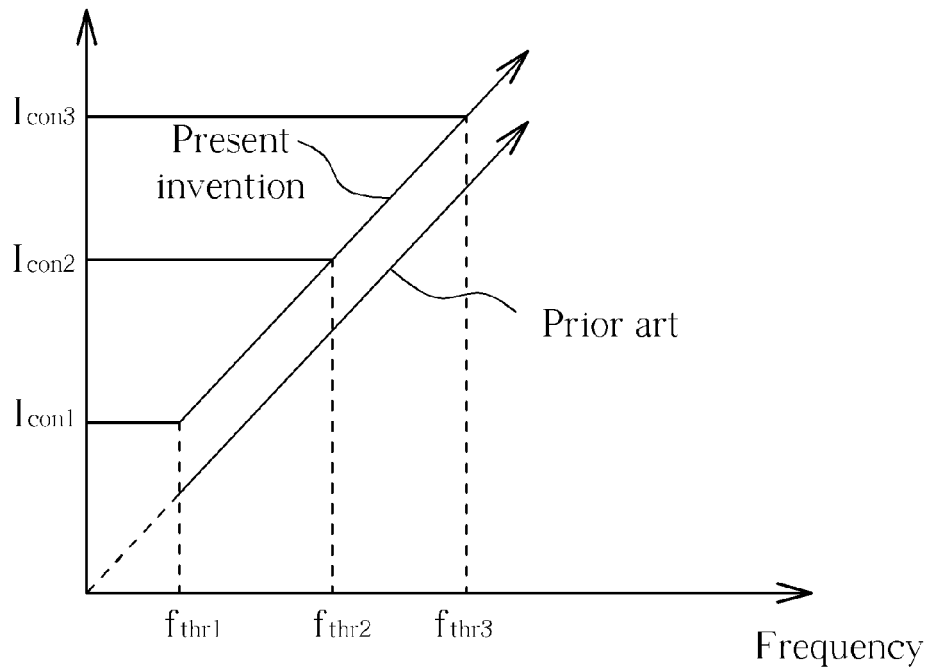
FIGS. 5A and 5B illustrate the relations between the output current and the input signal frequency, of the circuit shown in FIG. 4.

FIG. 4 is a circuit diagram for one example of the current providing system shown in FIG. 1. The current providing system 200 shown in FIG. 2 and the current providing system 400 shown in FIG. 4 have some overlapped devices. One difference between the embodiments shown in FIGS. 2 and 4 is that the comparator 213 shown in FIG. 2 is replaced by the comparator matrix 401 (including a plurality of comparators) in FIG. 4. Besides, the predetermined current providing circuit 105 comprises a plurality of devices 404, 406 and resistors 405, 410. That is, the predetermined current providing circuit 105 can select different switch devices and resistors, to provide predetermined currents with different current values. In the embodiment shown in FIG. 4, different comparators can be selected corresponding to different demands (i.e. selecting different reference voltages $V_{ref}$), thus different switch devices and resistors are coupled via the multiplexer 405. Accordingly, the operation of the circuit shown in FIG. 4 can be shown as FIG. 5A, it can be set to different frequency threshold values and the output current. That is, the output current can be set to a constant current $I_{con1}$, when a frequency of the input signal is smaller than the frequency threshold value $f_{thr1}$. The output current can be set to a constant current $I_{con2}$, when a frequency of the input signal is smaller than the frequency threshold value $f_{thr2}$, which is larger than $f_{thr1}$. By this way, the frequency threshold values and the output currents can be selected at random based on different demands.

Figure 5B:
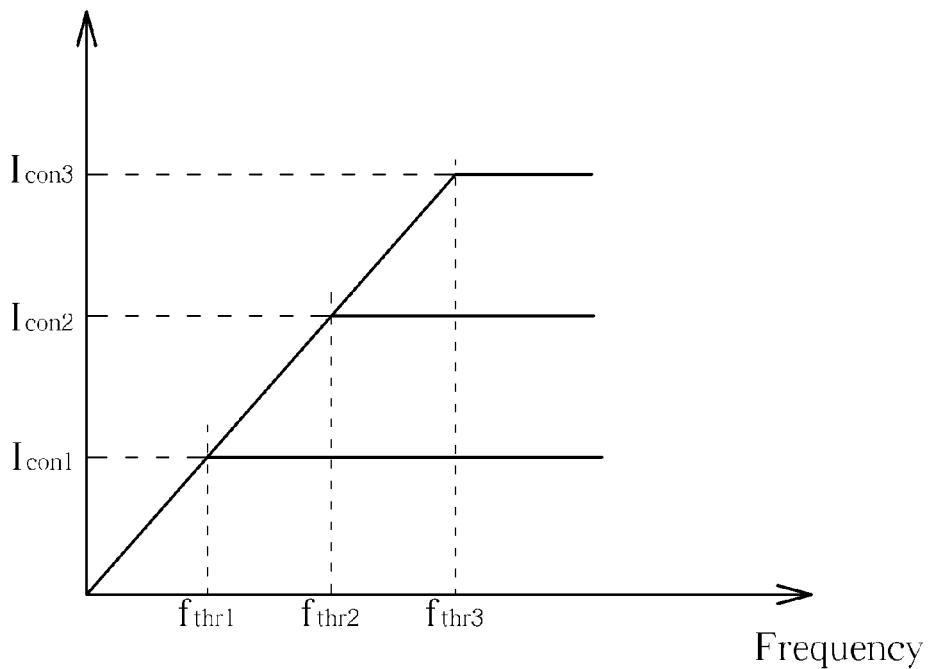
Figure 6:
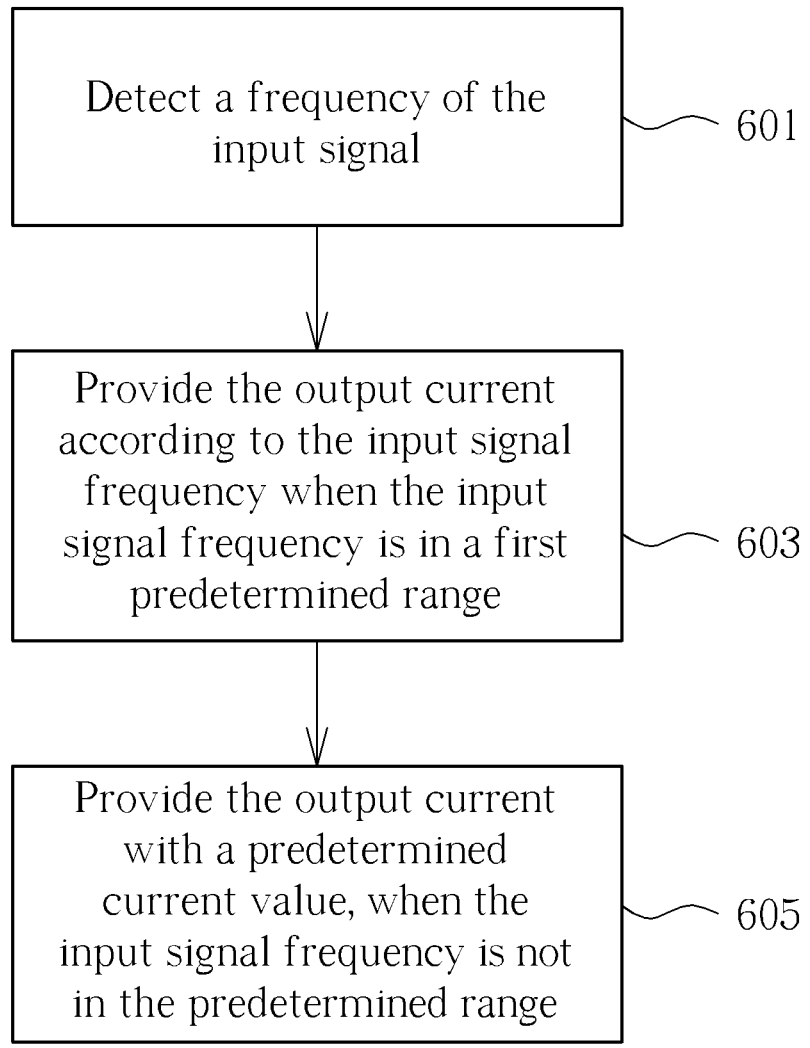
FIG. 6 is a flow chart illustrating the current providing method according to one embodiment of the present application.

FIG. 4 can utilize the operations shown in FIG. 3, as shown in FIG. 5B. That is, limit the output current at $I_{con1}$ when the input signal frequency is larger than $f_{thr1}$, or limit the output current at $I_{con2}$ larger than the output current at $I_{con1}$ when the input signal frequency is larger than $f_{thr2}$ larger than $f_{thr1}$. The frequency threshold values and the output currents can be selected at random based on different demands Via above-mentioned embodiments, a current providing method can be acquired. FIG. 6 is a flow chart illustrating the current providing method. The steps shown in FIG. 6 include:

Step 601

Detect a frequency of the input signal.

Step 603

Provide the output current according to the input signal frequency when the input signal frequency is in a first predetermined range Step 605

Provide the output current with a predetermined current value, when the input signal frequency is not in the predetermined range.

Other detail steps can be easily acquired via above-mentioned embodiments, thus are omitted for brevity here.

In view of above-mentioned embodiments, a constant current can be provided when the input signal has lower frequency, to avoid prior art current leakage problem. Besides, the current can also be limited when the frequency is high, such that over current issue can be avoided. Additionally, the present invention also provides current providing mechanism with multi regions, such that more flexible design can be obtained.

Those skilled in the art will readily observe that numerous modifications and alterations of the device and method may be made while retaining the teachings of the invention.

What is claimed is:

1. A current providing system, for providing an output current, comprising:

a frequency detecting circuit, for receiving at least one input signal, and for detecting a frequency of the input signal;

a frequency-controlled current providing circuit, for providing the output current according to the input signal frequency when the input signal frequency is in a first predetermined range; and a predetermined current providing circuit, for providing the output current with a first predetermined current value, when the input signal frequency is not in the first predetermined range.

2. The current providing system of claim 1, wherein the first predetermined range is between a first frequency threshold value and a second frequency threshold value larger than the first frequency threshold value, where the predetermined current providing circuit provides the output current with the first predetermined current value when the input signal frequency is smaller than the first frequency threshold value.

3. The current providing system of claim 1, wherein the first predetermined range is between a first frequency threshold value and a second frequency threshold value larger than the first frequency threshold value, where the predetermined current providing circuit provides the output current with the first predetermined current value when the input signal frequency is larger than the second frequency threshold value.

4. The current providing system of claim 1, wherein the frequency detecting circuit comprises:

a variable resistor circuit, for providing an input signal resistor according to the input signal frequency;

a current source, for providing an input signal current according to the input signal resistor;

a resistance device, for generating an input signal voltage according to the input signal current; and a comparator, for comparing the input signal voltage and a reference voltage, to determine the frequency of the input signal.

5. The current providing system of claim 1, wherein the frequency-controlled current providing circuit further provides the output current according to the input signal frequency, when the input signal frequency is in a second predetermined; where the predetermined current providing circuit provides the output current with a second predetermined current value when the input signal frequency is not in the second predetermined range; wherein the first predetermined range is different from the second predetermined range, and the first current value is different from the second current value.

6. The current providing system of claim 5, wherein the first predetermined range is between a first frequency threshold value and 0, where the predetermined current providing circuit provides the output current with the first predetermined current value when the input signal frequency is larger than the first frequency threshold value; wherein the second predetermined range is between a second frequency threshold value and 0, where the predetermined current providing circuit provides the output current with the second predetermined current value when the input signal frequency is larger than the second frequency threshold value.

7. The current providing system of claim 5, wherein the predetermined current providing circuit includes a plurality of resistors for respectively providing the output currents with different current values, where the current providing system further comprises a multiplexer, for selectively coupling the frequency detecting circuit to one of the resistors.

8. The current providing system of claim 7, wherein the frequency detecting circuit comprises:

a variable resistor circuit, for providing an input signal resistor according to the input signal frequency;

a current source, for providing an input signal current according to the input signal resistor;

a resistance device, for generating an input signal voltage according to the input signal current; and a comparator matrix, for comparing the input signal voltage and one of the reference voltages, to determine the input signal frequency.

9. An analog to digital converter, comprising:

a current providing system, for providing an output current, comprising:

a frequency detecting circuit, for receiving at least one input signal, and for detecting a frequency of the input signal;

a frequency-controlled current providing circuit, for providing the output current according to the input signal frequency when the input signal frequency is in a first predetermined range; and a predetermined current providing circuit, for providing the output current with a first predetermined current value, when the input signal frequency is not in the first predetermined range.

10. The analog to digital converter of claim 9, wherein the first predetermined range is between a first frequency threshold value and a second frequency threshold value larger than the first frequency threshold value, where the predetermined current providing circuit provides the output current with the first predetermined current value when the input signal frequency is smaller than the first frequency threshold value.

11. The analog to digital converter of claim 9, wherein the first predetermined range is between a first frequency threshold value and a second frequency threshold value larger than the first frequency threshold value, where the predetermined current providing circuit provides the output current with first predetermined current value when the input signal frequency is larger than the second frequency threshold value.

12. The analog to digital converter of claim 9, wherein the frequency detecting circuit comprises:

a variable resistor circuit, for providing an input signal resistor according to the input signal frequency;

a current source, for providing an input signal current according to the input signal resistor;

a resistance device, for generating an input signal voltage according to the input signal current; and a comparator, for comparing the input signal voltage and a reference voltage, to determine a frequency of the input signal.

13. The analog to digital converter of claim 9, wherein the frequency-controlled current providing circuit further provides the output current according to the input signal frequency, when the input signal frequency is in a second predetermined; where the predetermined current providing circuit provides the output current with a second predetermined current value when the input signal frequency is not in the second predetermined range; wherein the first predetermined range is different from the second predetermined range, and the first current value is different from the second current value.

14. The analog to digital converter of claim 13, wherein the first predetermined range is between a first frequency threshold value and 0, where the predetermined current providing circuit provides the output current with the first predetermined current value when the input signal frequency is larger than the first frequency threshold value; wherein the second predetermined range is between a second frequency threshold value and 0, where the predetermined current providing circuit provides the output current with the second predetermined current value when the input signal frequency is larger than the second frequency threshold value.

15. The analog to digital converter of claim 13, wherein the predetermined current providing circuit includes a plurality of resistors for respectively providing the output currents with different current values, where the current providing system further comprises a multiplexer, for selectively coupling the frequency detecting circuit to one of the resistors.

16. The analog to digital converter of claim 15, wherein the frequency detecting circuit comprises:

a variable resistor circuit, for providing an input signal resistor according to the input signal frequency;

a current source, for providing an input signal current according to the input signal resistor;

a resistance device, for generating an input signal voltage according to the input signal current; and a comparator matrix, for comparing the input signal voltage and one of the reference voltages, to determine the input signal frequency.

17. A current providing method, for providing an output current, comprising:

(a) detecting a frequency of the input signal;

(b) providing the output current according to the input signal frequency when the input signal frequency is in a first predetermined range; and (c) providing the output current with a first predetermined current value, when the input signal frequency is not in the first predetermined range.

18. The current providing method of claim 17, wherein the first predetermined range is between a first frequency threshold value and a second frequency threshold value larger than the first frequency threshold value, where step (c) provides the output current with first predetermined current value when the input signal frequency is smaller than the first frequency threshold value.

19. The current providing method of claim 17, wherein the first predetermined range is between a first frequency threshold value and a second frequency threshold value larger than the first frequency threshold value, where the step (c) provides the output current with first predetermined current value when the input signal frequency is larger than the second frequency threshold value.

20. The current providing method of claim 17, wherein the step (b) further provides the output current according to the input signal frequency, when the input signal frequency is in a second predetermined; where the step (c) provides the output current with a second predetermined current value when the input signal frequency is not in the second predetermined range; wherein the first predetermined range is different from the second predetermined range, and the first current value is different from the second current value.

21. The current providing method of claim 20, wherein the first predetermined range is between a first frequency threshold value and 0, where the predetermined current providing circuit provides the output current with the first predetermined current value when the input signal frequency is larger than the first frequency threshold value; wherein the second predetermined range is between a second frequency threshold value and 0, where the predetermined current providing circuit provides the output current with the second predetermined current value when the input signal frequency is larger than the second frequency threshold value.

* * * * *